(12) United States Patent
Kuroda

(10) Patent No.: US 8,704,627 B2
(45) Date of Patent: Apr. 22, 2014

(54) INDUCTOR ELEMENT, INTEGRATED CIRCUIT DEVICE, AND THREE-DIMENSIONAL CIRCUIT DEVICE

(75) Inventor: Tadahiro Kuroda, Yokohama (JP)

(73) Assignee: Keio University, Tokyo (JP)

( * ) Notice: Subject to any disclaimer, the term of this patent is extended or adjusted under 35 U.S.C. 154(b) by 0 days.

(21) Appl. No.: 12/992,466

(22) PCT Filed: May 12, 2009

(86) PCT No.: PCT/JP2009/058819
§ 371 (c)(1),
(2), (4) Date: Dec. 10, 2010

(87) PCT Pub. No.: WO2009/139372
PCT Pub. Date: Nov. 19, 2009

(65) Prior Publication Data
US 2011/0090036 A1    Apr. 21, 2011

(30) Foreign Application Priority Data

May 14, 2008   (JP) .................................. 2008-126934

(51) Int. Cl.
*H01F 5/00*   (2006.01)

(52) U.S. Cl.
USPC ........................................................ 336/200

(58) Field of Classification Search
USPC ............................. 336/65, 200, 232; 257/531
See application file for complete search history.

(56) References Cited

U.S. PATENT DOCUMENTS

| | | | |
|---|---|---|---|
| 5,227,659 A * | 7/1993 | Hubbard | 257/531 |
| 5,416,356 A | 5/1995 | Staudinger et al. | |
| 5,481,131 A | 1/1996 | Staudinger et al. | |
| 5,656,849 A * | 8/1997 | Burghartz et al. | 257/528 |
| 6,124,624 A * | 9/2000 | Van Roosmalen et al. | 257/531 |
| 6,420,773 B1 * | 7/2002 | Liou | 257/531 |
| 6,429,504 B1 * | 8/2002 | Beaussart et al. | 257/531 |
| 7,151,298 B1 * | 12/2006 | Eggert et al. | 257/355 |
| 7,382,219 B1 * | 6/2008 | Lee | 336/84 C |
| 7,768,790 B2 | 8/2010 | Kuroda et al. | |

(Continued)

FOREIGN PATENT DOCUMENTS

| | | |
|---|---|---|
| JP | 7-086523 A | 3/1995 |
| JP | 2002-009244 A | 1/2002 |

(Continued)

OTHER PUBLICATIONS

Niitsu, Kiichi et al "Interference from Power/Signal Lines and to SRAM Circuits in 65nm CMOS Inductive-Coupling Link," IEEE Asian Solid-State Circuits Conference, Nov. 12-14, 2007, pp. 131-134.

(Continued)

*Primary Examiner* — Tuyen Nguyen
(74) *Attorney, Agent, or Firm* — Westerman, Hattori, Daniels & Adrian, LLP

(57) ABSTRACT

The invention relates to an inductor element, an integrated circuit device and a three-dimensional circuit device where a wire passes through the opening of a coil so that the efficiency in the use of wires is high.

Coil elements are provided in the main direction of wires in at least two adjacent layer levels having different main directions of wires, and the coil elements are connected to coil elements formed in different layer levels so that a single coil is formed.

12 Claims, 12 Drawing Sheets

(56) References Cited

U.S. PATENT DOCUMENTS

| | | | |
|---|---|---|---|
| 7,851,257 B2* | 12/2010 | Marimuthu et al. | 438/108 |
| 2002/0011606 A1* | 1/2002 | Otake et al. | 257/200 |
| 2007/0289772 A1 | 12/2007 | Kuroda et al. | |

FOREIGN PATENT DOCUMENTS

| | | |
|---|---|---|
| JP | 2003-078017 A | 3/2003 |
| JP | 2005-228981 A | 8/2005 |
| JP | 2005-252272 A | 9/2005 |
| JP | 2005-348264 A | 12/2005 |
| JP | 2006-050354 A | 2/2006 |
| JP | 2006-0066454 A | 3/2006 |
| JP | 2006-105630 A | 4/2006 |
| JP | 2006-173415 A | 6/2006 |
| JP | 2006-173986 A | 6/2006 |

OTHER PUBLICATIONS

Miura, Noriyuki et al "Analysis and Design of Transceiver Circuit and Inductor Layout for Inductive Inter-chip Wireless Superconnect," 2004 IEEE Symposium on VLSI Circuits, Digest of Technical Papers, Jun. 17-19, 2004, pp. 246-249.

Miura, Noriyuki et al "A 1Tb/s 3W Inductive-Coupling Transceiver for Inter-Chip Clock and Data Link," IEEE International Solid-State Circuits Conference, Feb. 8, 2006, Session 23.4, pp. 11-13.

Miura, Noriyuki et al "Cross Talk Countermeasures in Inductive Inter-chip Wireless Superconnect," IEEE 2004 Custom Integrated Circuits Conference, 2004, pp. 99-102.

Miura, Noriyuki et al "A 0.14pJ/b Inductive-Coupling Inter-Chip Data Transceiver with Digitally-Controlled Precise Pulse Shaping," 2007 IEEE International Solid-State Circuits Conference, Feb. 13, 2007, Session 20.2, pp. 358-359.

Miura, Noriyuki et al "A 195Gb/s 1.2W 3D-Stacked Inductive Inter-Chip Wireless Superconnect with Transmit Power Control Scheme," 2005 IEEE International Solid-State Circuits Conference, Feb. 8, 2005, Session 14.5, pp. 264-265.

Miura, Noriyuki et al "An 11Gb/s Inductive-Coupling Link with Burst Transmission," 2008 IEEE International Solid-State Circuits Conference, Feb. 8, 2008, Session 15.7, pp. 298-299.

Mizoguchi, Daisuke et al "A 1.2Gb/s/pin Wireless Superconnect Based on Inductive Inter-Chip Signaling (IIS)," 2004 IEEE International Solid-State Circuits Conference, Feb. 17, 2004, Session 7.6.

International Search Report of PCT/JP2009/058819, mailing date Aug. 4, 2009.

* cited by examiner

F I G. 1
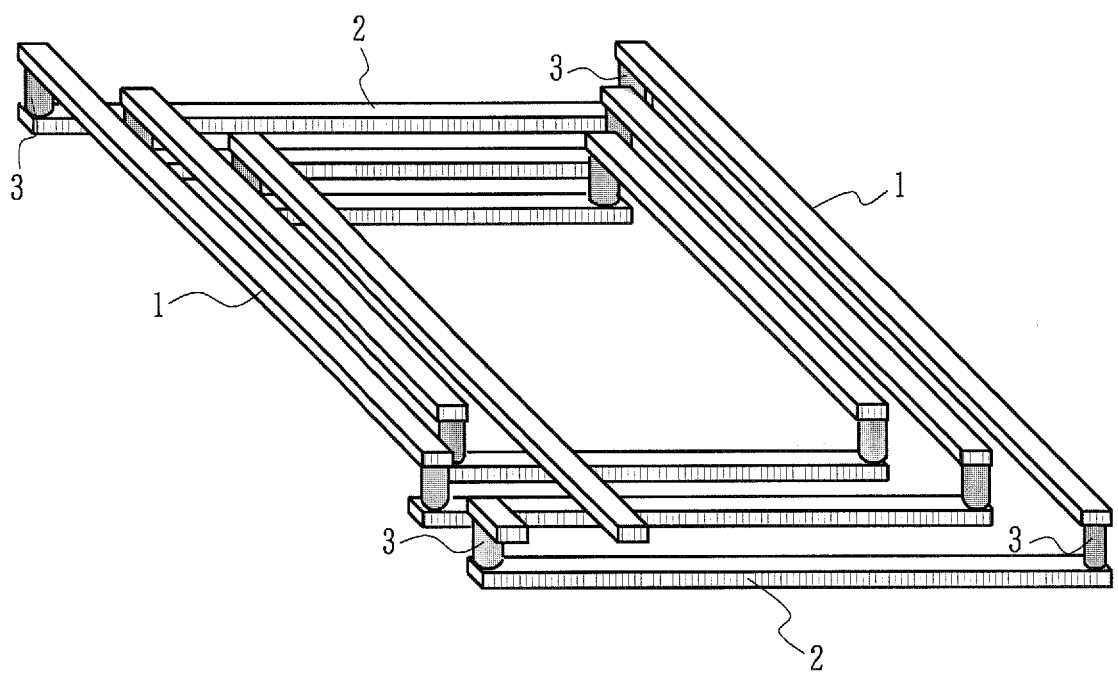

(a)

(b)

(a)

(b)

(c)

(d)

F I G. 9
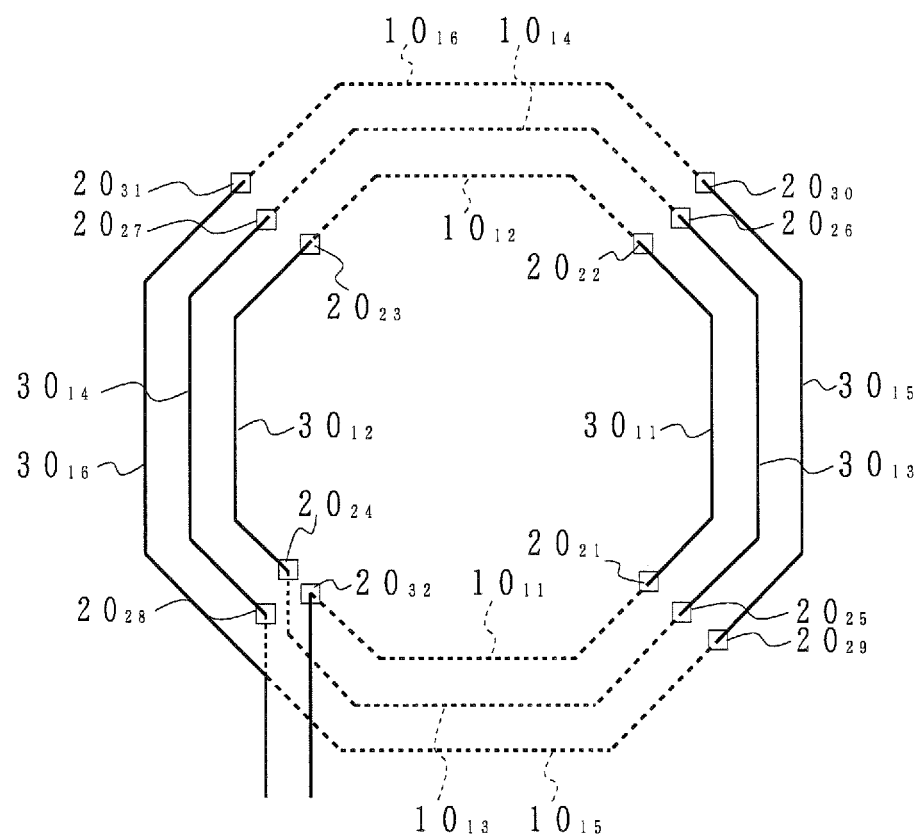

(a)

(b)

(PRIOR ART)

(PRIOR ART)

INDUCTOR ELEMENT, INTEGRATED CIRCUIT DEVICE, AND THREE-DIMENSIONAL CIRCUIT DEVICE

TECHNICAL FIELD

The present invention relates to an inductor element, an integrated circuit device and a three-dimensional circuit device, and in particular, to an inductor element, an integrated circuit device and a three-dimensional circuit device characterized by their structure: an inductor element for communication between substrates like bare IC chips or printed circuit boards using magnetic coupling is formed without greatly affecting the arrangement of other wires on bare IC chips or printed circuit boards.

BACKGROUND ART

Together with the miniaturization of portable electronics in recent years, integrated semiconductor circuit devices have been required to be mounted with higher density. In order to make this possible, attempts have been made to stack a number of semiconductor chips three-dimensionally.

In three-dimensional integrated semiconductor circuit devices, semiconductor chips are generally connected through micro-bumps so that signals can be exchanged between them. In the case where there are three or more semiconductor chips, however, it is necessary to have through vias that penetrate through the chip(s) in between.

In order to create these, a complex manufacturing process is required, as well as high processing precision.

A method for electrically connecting semiconductor chips through capacitive coupling has also been proposed. In this case also, there are few problems when there are two semiconductor chips but the efficiency of signal transmission is much lower when there are three or more. In order to compensate for this, high power is required, and a problem arises, such that the power consumption increases.

Another method that has been proposed is one for mounting an antenna on a semiconductor chip for communication between chips. In this case also a problem arises, such that the efficiency of transmission is low when there are three or more semiconductor chips.

Because, a multilayer wiring structure is formed by providing interlayer insulating films, such as of oxide or nitride, on a silicon substrate having impurity-doped regions, and therefore the electrical field generated by the antenna passes through regions of different dielectric constants, such as impurity-doped regions, the silicon substrate, the oxide films and the nitride films, in the semiconductor chip.

In the case where an electrical field passes through films having different dielectric constants, there is reflection in the interface, and thus the efficiency of signal transmission is low.

Thus the present inventors proposed magnetic field communication through inductive coupling between chips mounted and stacked using coils formed of wires on the chips of LSI (integrated circuit device) (see for example Patent Documents 1 to 7 and Non-Patent Documents 1 to 8).

Here, the three-dimensional integrated circuit device for a magnetic field communication proposed by the present inventors is described.

FIGS. 11(a) and 11(b) are diagrams illustrating the structure of the coil for magnetic field communication (see for example FIG. 2 in Non-Patent Document 2). FIG. 11(a) is a conceptual perspective diagram, and FIG. 11(b) is a conceptual projection plan diagram.

As shown in the figures, two pairs of rectangular spirals are formed of a metal wire in middle and upper layers which are approximately the same in shape, and the rectangular spirals are alternately connected up and down through vias to form one coil as a whole.

Concretely, if the coil wire is followed from point A, the lower layer metal wire runs out from point A (broken line), connects to the middle layer metal wire through a via (diamond), which makes one round clockwise (dotted line) and connects to the upper layer metal wire through another via (square). The upper layer metal wire makes two rounds clockwise (solid line) and connects to the middle layer metal wire again through yet another via (square), which makes two rounds clockwise (dotted line), connects to the upper layer metal wire again through still another via (square), which makes one round clockwise (solid line) and runs to point B.

Concerning magnetic field communication using this coil, the present inventors examined the cross talk occurring not only in the signal receiving coil facing the transmitting coil but also in the receiving coil adjacent to this receiving coil. They found that when the interval between adjacent coils are set to a certain value, the value gained by integrating the magnetic flux density B within the receiving coils becomes 0; that is to say, cross talk can be prevented (see Patent Document 4).

The present inventors also examined the effects of a peripheral wire on the efficiency of signal transmission when it was provided between such a pair of facing coils (see Non-Patent Document 8). They confirmed that a peripheral wire running in one direction like conventional bus lines barely affect the efficiency of transmission.

Here, in the case of a wiring pattern forming a closed circuit, an eddy current is generated in the peripheral wire due to the magnetic field from the coil, and this eddy current causes the efficiency of transmission to get lower.

PRIOR ART DOCUMENTS

Patent Documents

Patent Document 1: Japanese Unexamined Patent Publication 2005-228981
Patent Document 2: Japanese Unexamined Patent Publication 2005-348264
Patent Document 3: Japanese Unexamined Patent Publication 2006-050354
Patent Document 4: Japanese Unexamined Patent Publication 2006-066454
Patent Document 5: Japanese Unexamined Patent Publication 2006-105630
Patent Document 6: Japanese Unexamined Patent Publication 2006-173986
Patent Document 7: Japanese Unexamined Patent Publication 2006-173415

Non-Patent Documents

Non-Patent Document 1: D. Mizoguchi et al. "A 1.2 Gb/s/pin Wireless Superconnect based on Inductive Inter-chip Signaling (IIS)", IEEE International Solid-State Circuits Conference (ISSCC'04), Dig. Tech. Papers, pp. 142-143, 517, February 2004.
Non-Patent Document 2: N. Miura et al. "Analysis and Design of Transceiver Circuit and Inductor Layout for Inductive Inter-chip Wireless Superconnect", Symposium on VLSI Circuits, Dig. Tech. Papers, pp. 246-249, June 2004.

Non-Patent Document 3: N. Miura et al, "Cross Talk Countermeasures in Inductive Inter-Chip Wireless Superconnect", in Proc. IEEE Custom Integrated Circuits Conference (CICC' 04), pp. 99-102, October 2004.

Non-Patent Document 4: N. Miura, D. Mizoguchi, M. Inoue, H. Tsuji, T. Sakurai and T. Kuroda, "A 195 Gb/s 1.2 W 3D-Stacked Inductive Inter-Chip Wireless Superconnect with Transmit Power Control Scheme", IEEE International Solid-State Circuits Conference (ISSCC' 05), Dig. Tech. Papers, pp. 264-265, February 2005.

Non-Patent Document 5: N. Miura, D. Mizoguchi, M. Inoue, K. Niitsu, Y. Nakagawa, M. Tago, M. Fukaishi, T. Sakurai and T. Kuroda, "A 1Tb/s 3W Inductive-Coupling Transceiver for Inter-Chip Clock and Data Link", IEEE International Solid-State Circuits Conference (ISSCC' 06), Dig. Tech. Papers, pp. 424-425, February 2006.

Non-Patent Document 6: N. Miura, He. Ishikuro, T. Sakurai, and T. Kuroda, "A 0.14 pJ/b Inductive-Coupling Inter-Chip Data Transceiver with Digitally-Controlled Precise Pulse Shaping", IEEE International Solid-State Circuits Conference (ISSCC' 07), Dig. Tech. Papers, pp. 264-265, February 2007.

Non-Patent Document 7: N. Miura, Y. Kohama, Y. Sugimori, H. Ishikuro, T. Sakurai and T. Kuroda, "An 11Gb/s Inductive-Coupling Link with Burst Transmission", IEEE International Solid-State Circuits Conference (ISSCC09), Dig. Tech. Papers, pp. 298-299, February 2008.

Non-Patent Document 8: K. Niitu, Y. Sugimori, Y. Kohama, K. Osada, N. Irei, H. Ishikuro, and T. Kuroda, "Interference from Power/Signal Lines and to SRAM Circuits in 65 nm CMOS Inductive-Coupling Link", IEEE Asian Solid-State Circuits Conference, Dig. Tech. Papers, pp. 131-134, Nov. 2007.

SUMMARY OF THE INVENTION

Problem to be Solved by the Invention

In coils having such conventional structures, spirals are formed in the same plane, and thus other metal wires in the same layer cannot cross the coil. Accordingly, the region without wire (opening) at the center of the coil cannot be used, and thus a problem arises, such that other wires must run around the coil.

FIG. 12 is a conceptual projection plan diagram showing the relationship between the coil and peripheral wires, and represents an example where a pattern is created around the coil by alternately connecting the upper layer metal wire and the middle layer metal wire.

When a coil having a conventional structure is used in this manner, a problem arises, such that the efficiency in the use of wires in the integrated circuit lowers.

Accordingly, an object of the present invention is to increase the efficiency in the use of wires by allowing them to run through the opening of the coil.

Means for Solving Problem

FIG. 1 is a diagram showing the basic structure of the present invention. The means for solving the problem is described below in reference to this figure.

In the figure, 3 is a connection via for connecting coil elements.

In order to solve the above problems, the present invention provides an inductor element where coil elements 1 and 2 are provided in the main direction of the wires in at least two adjacent layer levels having different main directions of wires, as shown in FIG. 1, and the coil elements 1 are connected to coil elements 2 in a different layer level or vice versa so that two form a single coil.

In the present specification "layer level" means a layer having wires in the same level.

Thus, coil elements 1 and 2 in the main direction of wires are provided in each layer level, so that the center portion of the coil has openings in each layer level in a direction different from that in which the coil elements 1 and 2 run, and therefore it becomes possible to provide a peripheral wire that passes through the opening in the direction in which the coil elements 1 and 2 run.

In particular, the coil elements 1 and 2, major portion of which are typically straight lines on either side of a center portion.

The single coil may be formed of coil elements 1 and 2 in two layer levels with perpendicular main directions of wires.

In this case, the coil elements 1 and 2 may all be formed of straight wires, or some coil elements 1 and 2 may be formed of a straight, main wire part and a bent, sub-wire part.

Furthermore, the coil elements 1 and 2 may be formed of a straight, main wire part and bent wire parts connected at either end of the main wire part that bend 45° toward the center so as to form an octagonal single coil.

When the coil is closer to circular shape, the performance is better.

In addition, one coil may be formed of two sub-coils formed of coil elements 1 and 2 in two layer levels having perpendicular main directions of wires, which are layered on top of each other. In this case, the first sub-coil may wind inward and the second sub-coil outward so that the inductance is two times higher in the same area.

Furthermore, one coil may be formed of straight coil elements 1 and 2 provided in four layer levels with the main direction of wires rotated 45° in each successive level and all of the four layer levels connected between adjacent layer levels.

In this case also one high-performance octagonal coil can be formed.

It is desirable for a peripheral wire to be run in the main direction of the wires in each layer level through the center portion of each coil so that the density of the wires is high, which makes for higher integration.

Inductor elements having the above described structure are typically mounted in a semiconductor chip so as to form an integrated semiconductor circuit device, but may also be mounted on a printed circuit board so as to form an integrated circuit device.

In addition, a number of such integrated circuit devices may be stacked on top of each other so as to form a three-dimensional circuit device, and thus integrated circuit devices can magnetically communicate with each other through inductor elements. As a result, communication between substrates can be achieved with high efficiency of transmission without requiring a high level of precision in processing.

Effects of the Invention

In the integrated circuit according to the present invention, a wire can be provided so as to cross the coil through the opening in the coil, and therefore coils and other wires in the circuit can be integrated in a smaller area with less wiring and fewer number of vias.

BRIEF DESCRIPTION OF THE DRAWINGS

FIG. 1 is a diagram showing the basic structure of the present invention;

FIG. 9 is a conceptual projection plan diagram of the inductor element according to the fifth embodiment of the present invention;

BEST MODE FOR CARRYING OUT THE INVENTION

Figure 2:
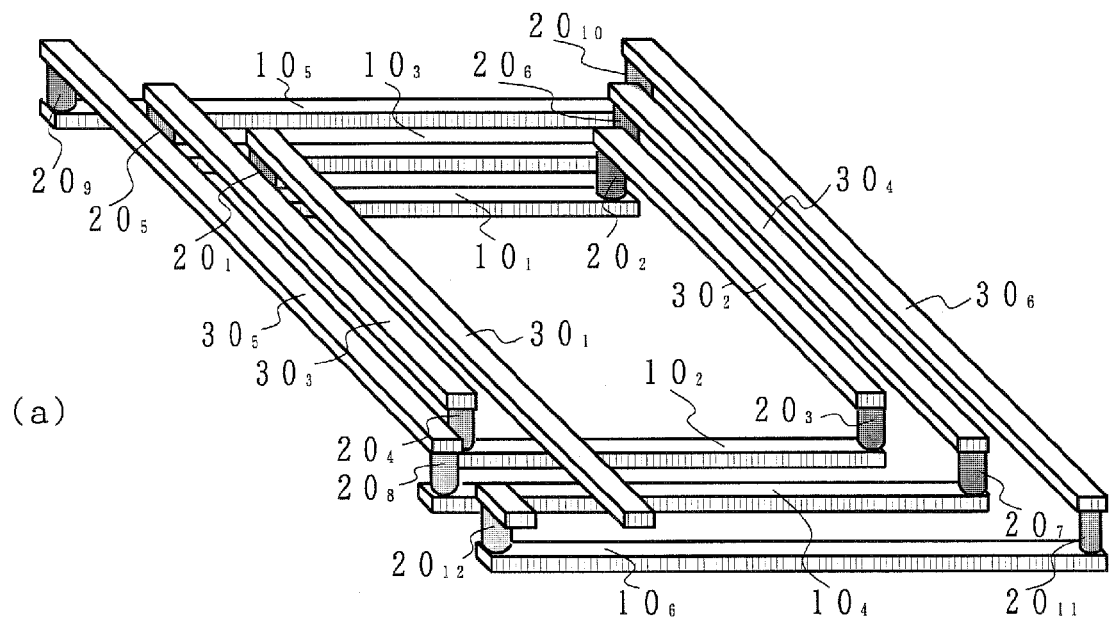
FIGS. 2(a) and 2(b) are diagrams showing the structure of the inductor element according to the first embodiment of the present invention.
Figure 2:
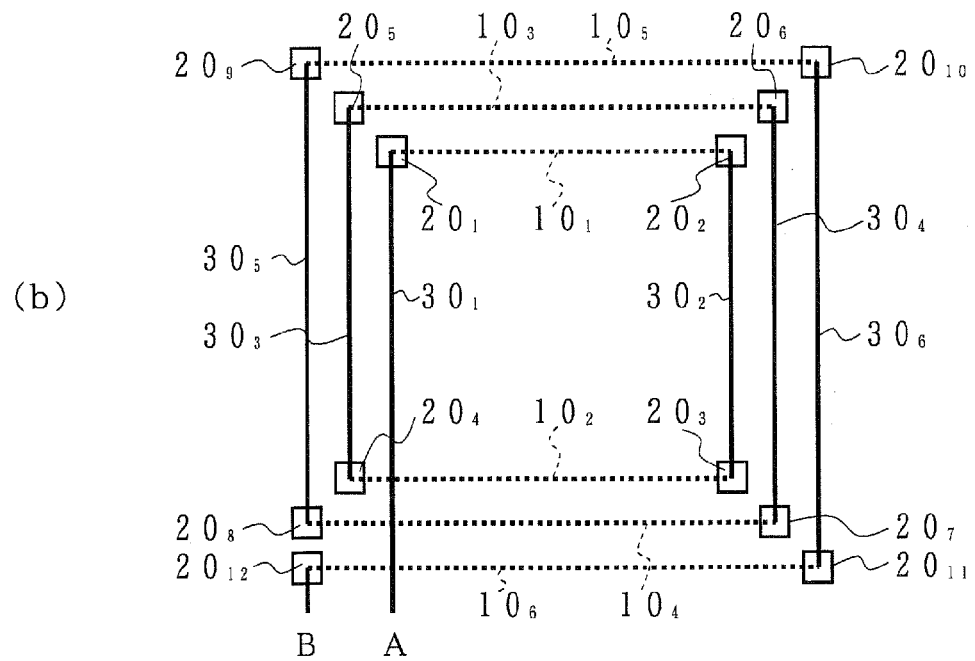

According to the present invention, coil elements are provided in the main direction of wires in at least two adjacent layer levels having different main directions of wires, and the coil elements are connected to coil elements formed in a different layer level so as to form a single coil.

Typically there are at least two layer levels having different main directions of wires, and coil elements in each layer level have a straight main portion on either side of the center portion, and the two ends of each coil element are connected to a coil element in a different layer level so as to form a single coil.

In this case the inductance of each coil typically has a value of 1 to 10 nH, which makes communication between substrates possible.

The coil elements may be formed of wire parts that are all straight, or at least some of the coil elements may be formed of straight main wire parts and bent sub-wire parts.

Furthermore, coil elements may be formed of a straight wire part and a bent part that is connected to the two ends of straight, main wire parts and bends 45° toward the center.

In addition, the single coil may be formed of coil elements in two layer levels having perpendicular main directions of wires.

In this case the single coil may be formed of two sub-coils formed of coil elements in two layer levels having perpendicular main directions of wires and layered on top of each other.

Alternatively, one coil may be formed of coil elements, at least main portion of which are straight, provided in four layer levels with the main direction of wires rotated 45° in each successive level and all of the four layer levels connected between adjacent layer levels from the first layer level to the fourth layer level.

That is to say, the coil elements are connected in the order: layer level$_1$→layer level$_2$→layer level$_3$→layer level$_4$→layer level$_1$→layer level$_2$→layer level$_3$→layer level$_4$→layer level$_1$→layer level$_2$ . . . .

Typically the center portion of each coil is provided with a peripheral wire or wires in the main direction of wires in each layer level.

In addition, a three-dimensional circuit device may be formed by stacking a number of semiconductor chips or printed circuit boards, each of which is provided with an inductor element mounted on it, so that integrated circuit devices can magnetically communicate using the inductor elements.

First Embodiment.

Taking the above into consideration, the inductor element according to the first embodiment of the present invention is described in reference to FIGS. 2 to 5.

FIGS. 2(a) and 2(b) are diagrams illustrating the structure of the inductor element according to the first embodiment of the present invention. FIG. 2(a) is a conceptual perspective diagram, and FIG. 2(b) is a conceptual projection plan diagram.

As shown in the figures, straight first coil elements 10 are formed of first layer metal wires and second coil elements 30 which run in a direction perpendicular to the first coil elements are formed of second layer metal wires, and the first coil elements 10 and the second coil elements 30 are alternately connected through connection vias 20 so that a single coil that winds clockwise is formed.

In this case the direction in which the coil elements are wired is the same as that in which main wires, for example bus lines, are wired in each layer.

Here, the coil elements 10 and 30 are formed in a line and space pattern with a width of 1 μm, and the length of the coil elements 10 and 30 around the periphery is 100 μm, for example. Here, in FIG. 2(b), the second coil elements 30 are the solid lines and the first coil elements 10 are the dotted lines.

If the coil wire is followed from point A, a second coil element $30_1$ leads out from point A, one end of which is connected to one end of a first coil element $10_1$ through a connection via $20_1$, the other end of which is connected to one end of a second coil element $30_2$ through a connection via $20_2$.

The other end of the second coil element $30_2$ is connected to a first coil element $10_2$ through a connection via $20_3$, the other end of which is connected to one end of a second coil element $30_3$ through a connection via $20_4$.

The other end of the second coil element $30_3$ is connected to a first coil element $10_3$ through a connection via $20_5$, the other end of which is connected to one end of a second coil element $30_4$ through a connection via $20_6$.

The other end of the second coil element $30_4$ is connected to a first coil element $10_4$ through a connection via $20_7$, the other end of which is connected to one end of a second coil element $30_5$ through a connection via $20_8$.

The other end of the second coil element $30_5$ is connected to a first coil element $10_5$ through a connection via $20_9$, the other end of which is connected to one end of a second coil element $30_6$ through a connection via $20_{10}$.

The other end of the second coil element $30_6$ is connected to a first coil element $10_6$ through a connection via $20_{11}$, the other end of which is connected to point B through a connection via $20_{12}$.

Figure 3:
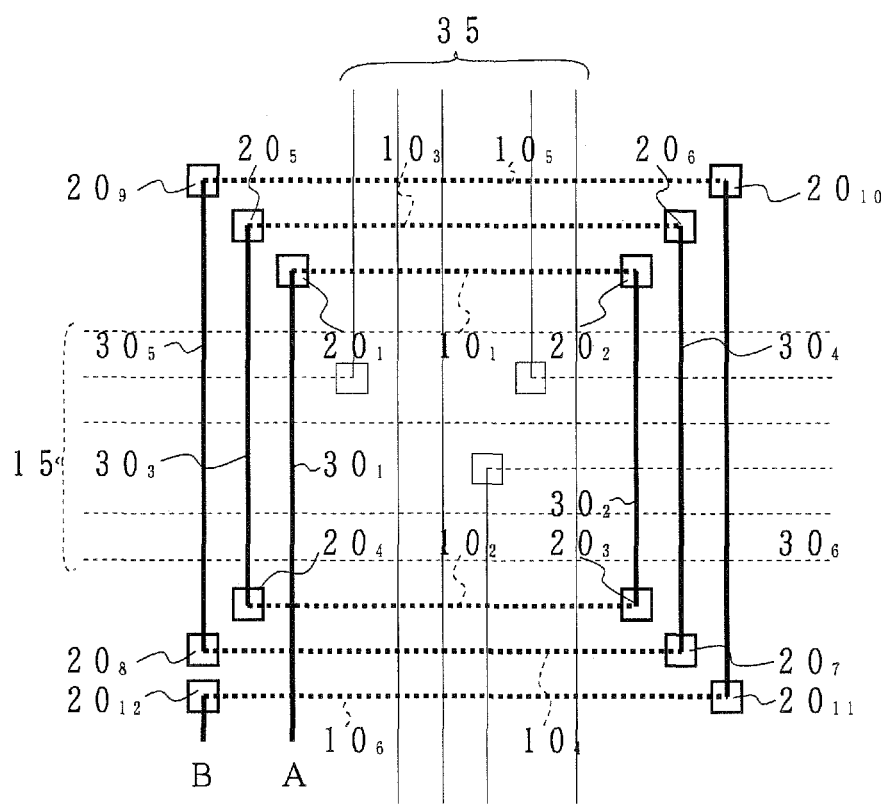
FIG. 3 is a conceptual projection plan diagram of the inductor element with peripheral wires.

FIG. 3 is a conceptual projection plan diagram showing an inductor element with peripheral wires. The peripheral wires are distinguished from the coil elements that form the inductor element by the thickness of the lines; the peripheral wires are thinner.

Here, the peripheral wires 35 formed of second layer metal wires are the solid lines, and the peripheral wires 15 formed of first layer metal wires are the dotted lines.

As shown in the Figure, the peripheral wires 15 and 35 are formed so as to pass through the opening at the center of the coil, and thus the wire material at the center of the coil is used to provide wires that cross the coil.

Figure 4:
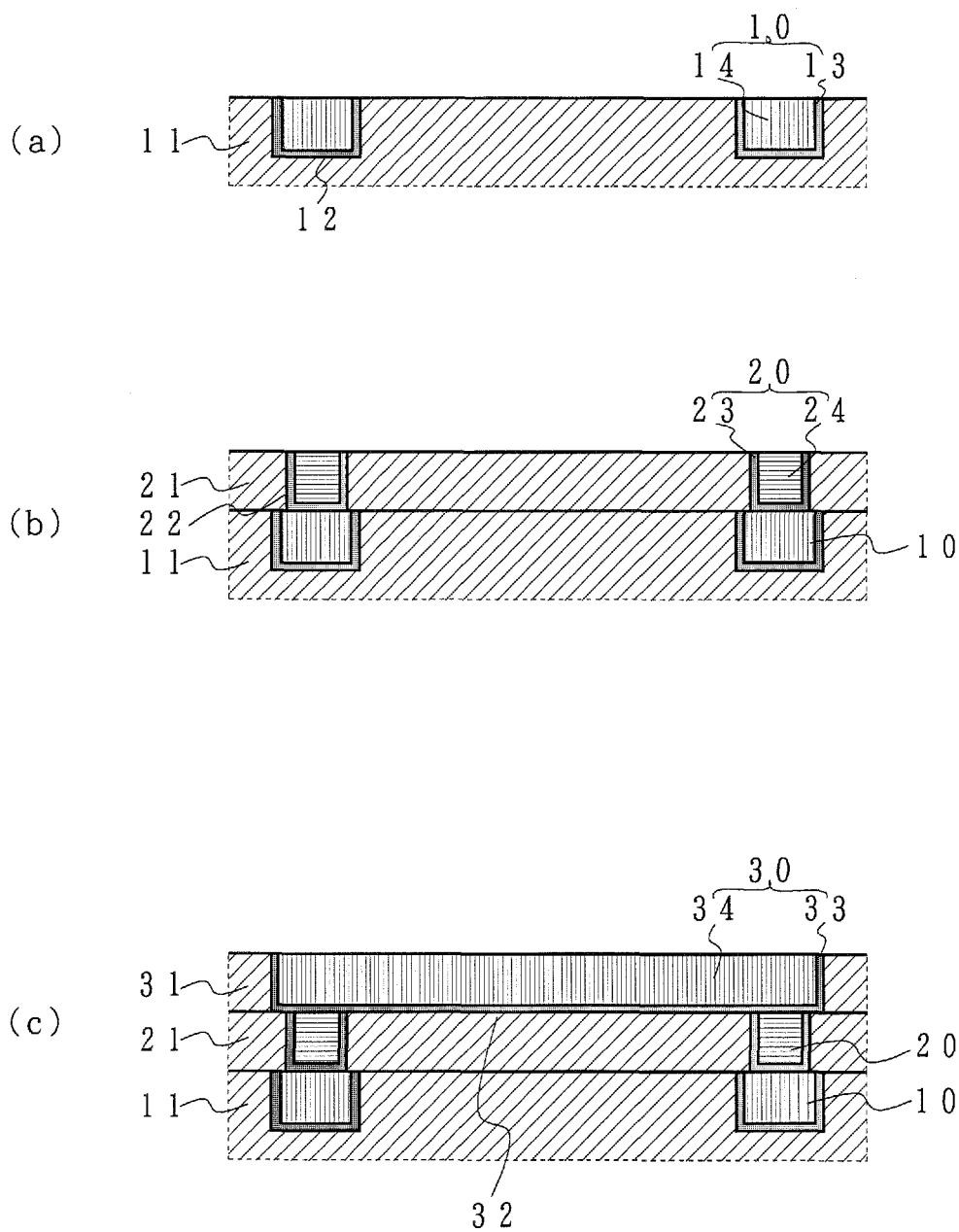
FIGS. 4(a) to 4(c) are diagrams illustrating the manufacturing process for the inductor element according to the first embodiment of the present invention.

Next, a manufacturing method for the inductor element according to the first embodiment of the present invention is described in reference to FIG. 4.

The figure shows only one interlayer insulating film layer for the sake of simplicity. The actual structure is formed of multiple films with a polishing stopping layer.

First, as shown in FIG. 4($a$), trenches 12 having a depth of 0.4 μm are created in a first interlayer insulating film 11 having a thickness of 0.8 μm, for example, and after that a Cu film 14 is deposited with a TaN film 13 in between, and the top surface is flattened by CMP (chemical mechanical polishing) method, so that first coil elements 10 having a buried wire structure are formed.

Next, as shown in FIG. 4($b$), a second interlayer insulating film 21 having a thickness of 0.4 μm, for example, is provided, and after that via holes 22 are created at such points as to make contact with the two ends of each first coil element 10. Next, these via holes 22 are filled in with a W film 24 with a TaN film 23 in between, and after that the top surface is again flattened by CMP method, so that connection vias 20 are formed.

Next, as shown in FIG. 4($c$), trenches 32 having a depth of 0.4 μm, for example, are created in the third interlayer insulating film 31 having a thickness of 0.4 μm, for example, and a Cu film 34 is deposited with a TaN film 33 in between so that the two ends of the film make contact with the connection vias 20, so that a pair of facing first coil elements 10 are connected, and the top surface is again flattened by CMP method, so that first coil elements 10 having a buried wire structure are formed, and thus the inductor element shown in FIG. 2($a$) is formed.

As described above, straight coil elements are alternately connected so as to form a single coil in accordance with the first embodiment of the present invention, and therefore the process is simple, and the opening at the center can be used effectively as a region for forming peripheral wires.

Figure 5:
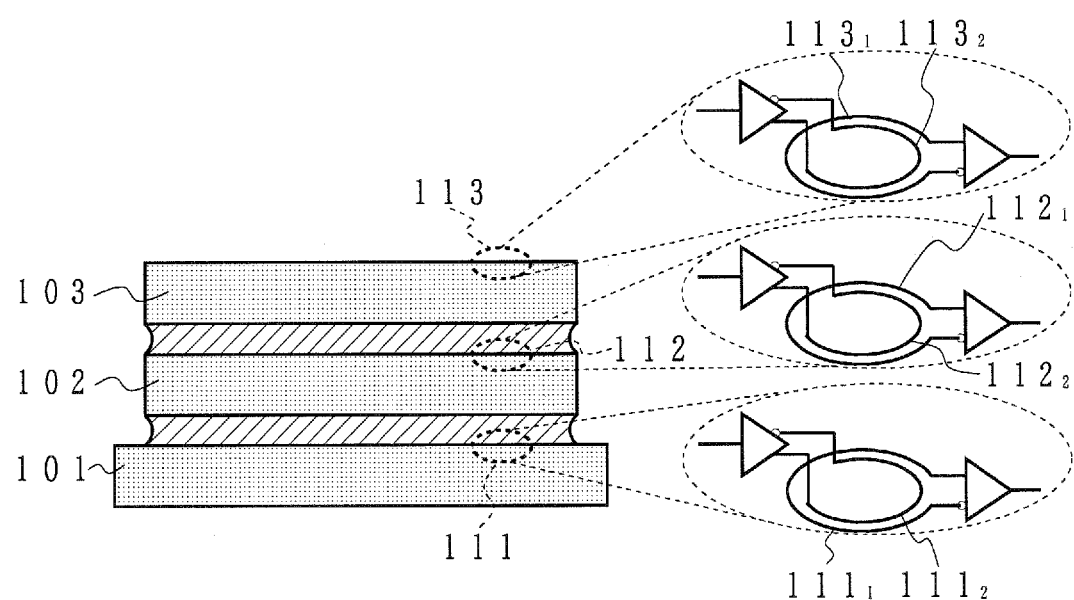
FIG. 5 is a conceptual diagram showing the structure of a three-dimensional integrated semiconductor circuit where semiconductor chips having the inductor element according to the first embodiment of the present invention are layered on top of each other.

FIG. 5 is a conceptual structural diagram showing a three-dimensional semiconductor integrated circuit device where semiconductor chips having the inductor element according to the first embodiment of the present invention are stacked on top of each other, and the chips can communicate using the inductor elements 111 to 113 provided in the respective semiconductor chips 101 to 103.

In this case, the inductor elements 111 to 113 are formed of pairs of receiving coils $111_1$ to $113_1$ and transmitting coils $111_2$ to $113_2$.

Here, the receiving coils $111_1$ to $113_1$ and transmitting coils $111_2$ to $113_2$ may be provided next to each other or in overlapping upper and lower layers.

In this case, the inductor elements 111 to 113 may be provided at such intervals that there is no cross talk, as in the above Patent Document 4.

In addition, even in the case where peripheral wires are provided so as to cross the opening at the center of each coil, they do not affect the efficiency of transmission for communication between the substrates, as confirmed in the above Non-Patent Document 8.

Second Embodiment

Figure 6:
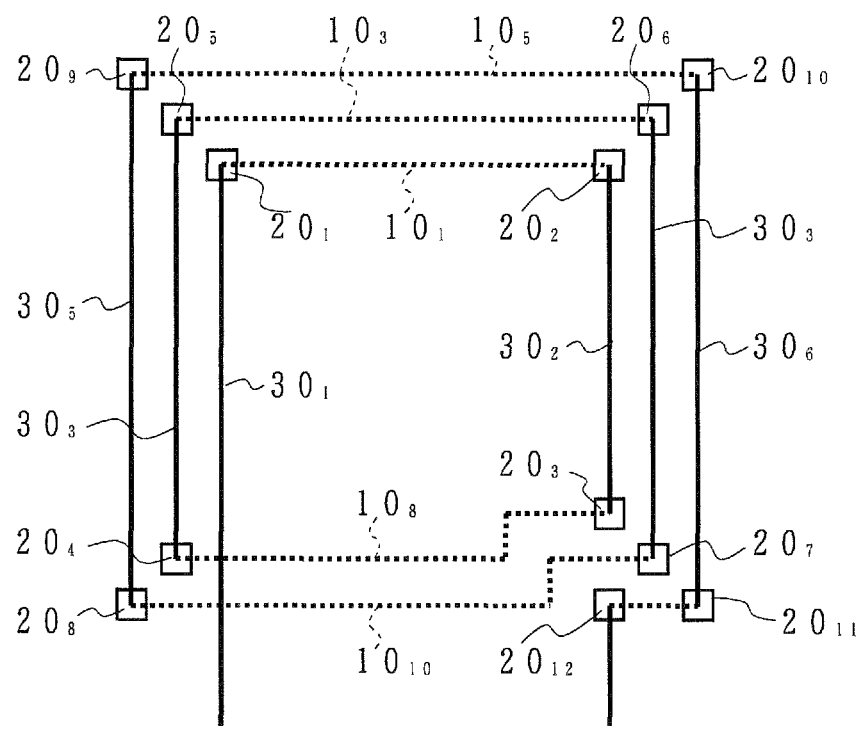
FIG. 6 is a conceptual projection plan diagram of the inductor element according to the second embodiment of the present invention.

Next, the inductor element according to the second embodiment of the present invention is described in reference to FIG. 6. The inductor element according to the second embodiment is different from that according to the first embodiment only in its pattern as seen from the top, and the basic manufacturing process is exactly the same, and therefore only the conceptual projection plan diagram is described.

Figure 10:
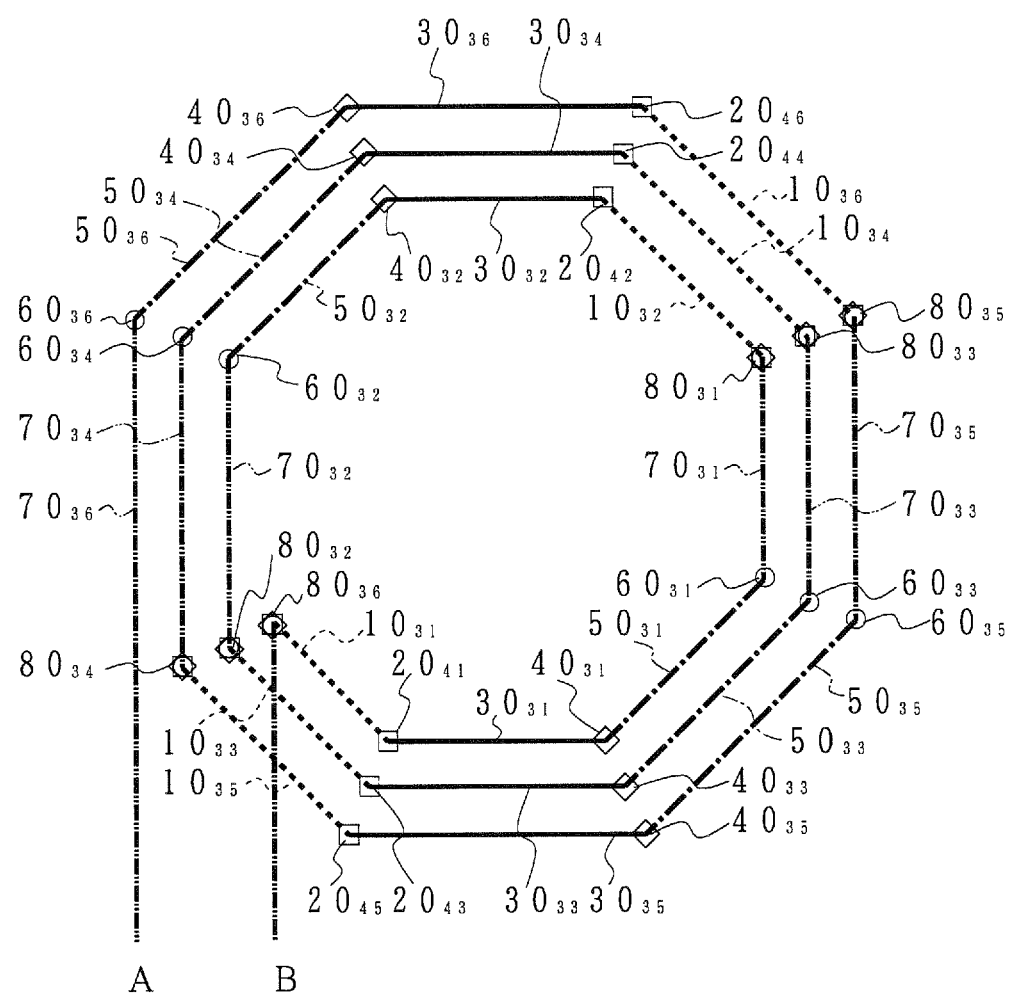
FIG. 10 is a conceptual projection plan diagram of the inductor element according to the sixth embodiment of the present invention.
Figure 11:
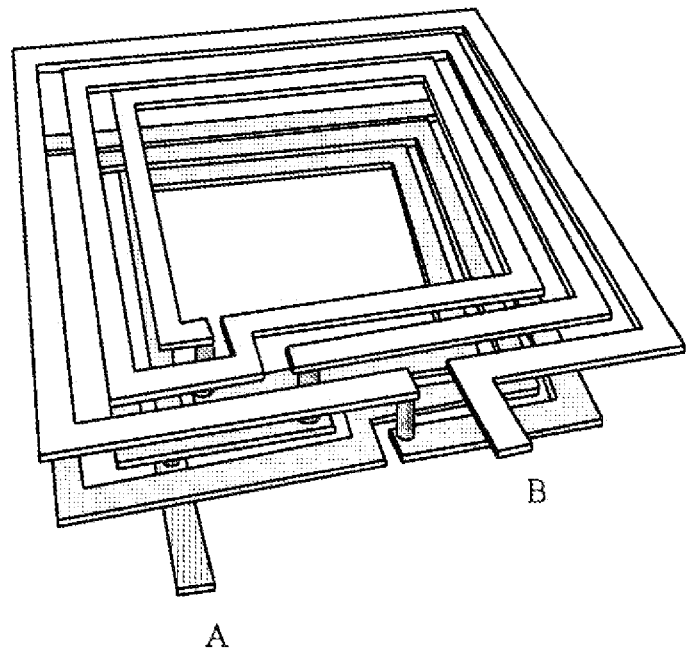
FIGS. 11(a) and 11(b) are diagrams illustrating the structure of the coil for magnetic field communication previously proposed by the present inventors.
Figure 11:
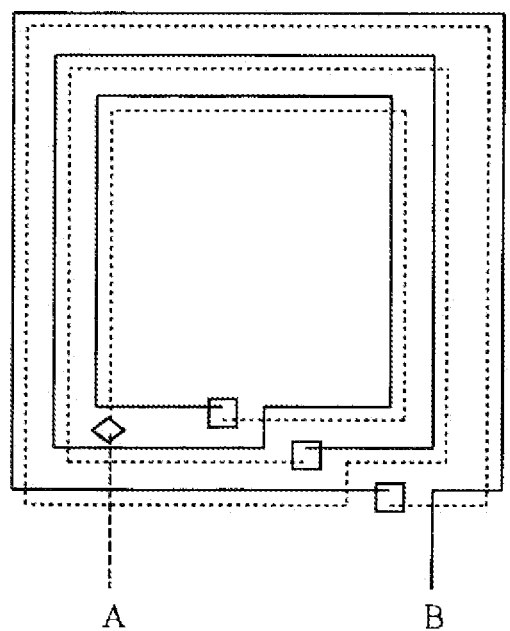
Figure 12:
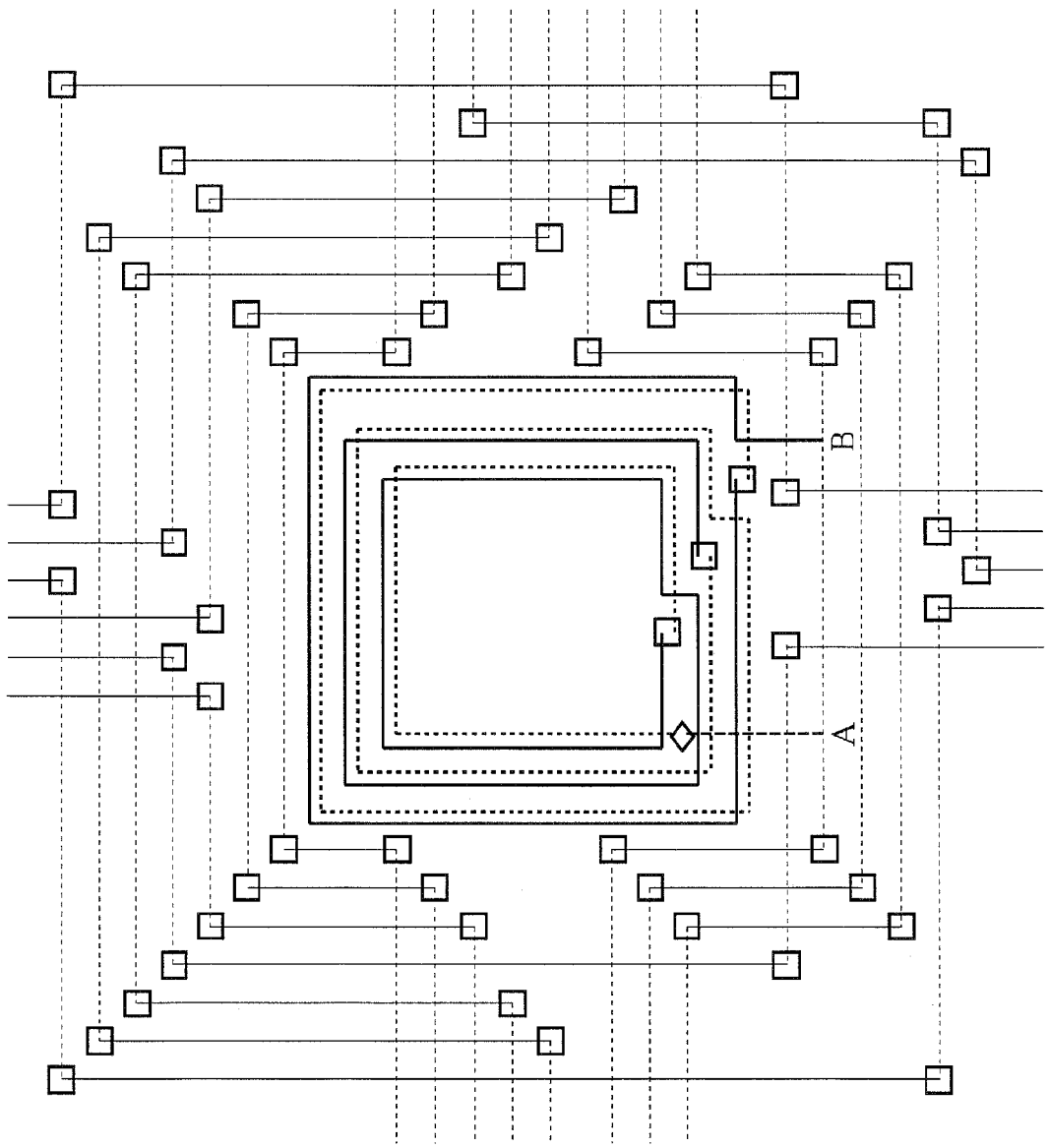
FIG. 12 is a conceptual projection plan diagram showing the relationship between the coil and the peripheral wires.

FIG. 6 is a conceptual projection plan diagram showing the inductor element according to the second embodiment of the present invention, and the projection plan pattern is the same as that for the conventional inductor element in FIG. 10. In the present case, two leads are formed using second layer metal wires.

In the second embodiment, connection vias are formed in the corners of the rectangle, and therefore the first coil elements $10_8$ and $10_{10}$ formed of first layer metal wires are bent, unlike in the above first embodiment, but the peripheral wires that cross the coil can be formed in the same manner as in the first embodiment.

Thus, some of the sides of the coil may be slightly bent in the layout, and no particular problems arise in the case where the number of peripheral wires which are prevented from crossing the coil because of the bend is relatively small.

Third Embodiment

Figure 7:
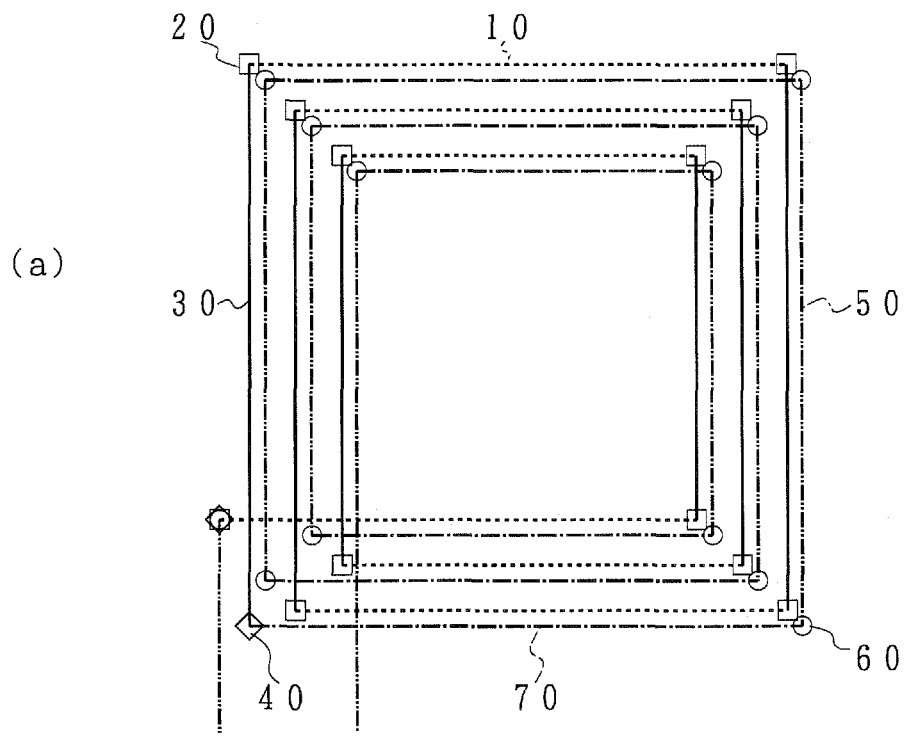
FIGS. 7(a) to 7(d) are diagrams showing the structure of the inductor element according to the third embodiment of the present invention.
Figure 7:
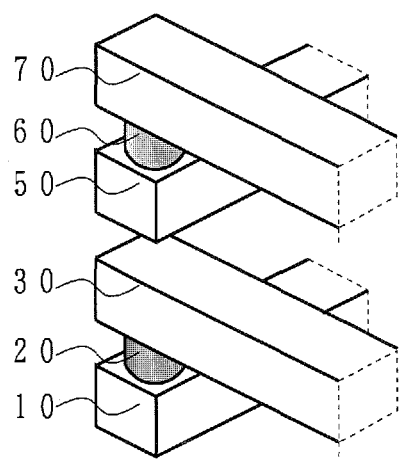
Figure 7:
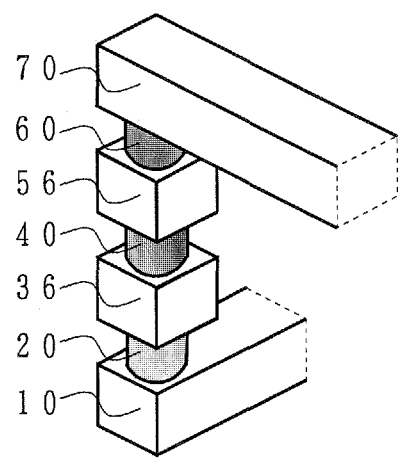
Figure 7:
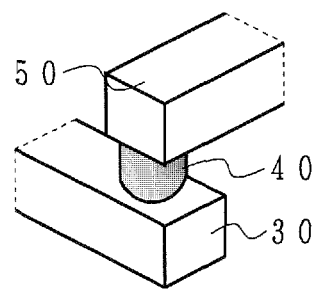

Next, the inductor element according to the third embodiment of the present invention is described in reference to FIG. 7. The inductor element according to this embodiment is gained by layering two inductor elements as in the above first embodiment and connecting them.

FIG. 7($a$) is a conceptual projection plan diagram showing the inductor element according to the third embodiment of the present invention, FIG. 7($b$) is a schematic perspective diagram showing a corner, FIG. 7($c$) is a schematic perspective diagram showing the portion that leads out from point B, and FIG. 7($d$) is a conceptual perspective diagram showing the connection portion between two sub-coils.

Here, the coil elements 10, 30, 50 and 70 may be formed in a line and space pattern with a width of 1 μm, for example.

In the figure, the first coil elements 10 are the dotted lines, the second coil elements 30 are the solid lines, the third coil elements 50 are the one-dot chain lines, and the fourth coil elements 70 are the two-dot chain lines.

As shown in the figures, straight first coil elements 10 are formed of first layer metal wires, the second coil elements 30, which run in a direction perpendicular to the first coil elements 10, are formed of second layer metal wires, and the first coil elements 10 and the second coil elements 30 are alternately connected through connection vias 20, so that a first sub-coil which winds clockwise is formed.

Here, the coil winds inward clockwise, unlike in the first embodiment.

Next, straight third coil elements 50 are formed of third layer metal wires, the fourth coil elements 70, which run in a direction perpendicular to the coil elements 50, are formed of fourth layer metal wires, and the second coil elements 50 and the fourth coil elements 70 are alternately connected through connection vias 60, so that a second sub-coil which winds clockwise is formed.

Here, the coil is exactly the same as in the first embodiment.

The first sub-coil and the second sub-coil are connected through a connection via 40, as shown in FIG. 7($d$).

In addition, the portion leading out from point B is connected in the order: connection via 20—connection via 40—connection via 60, and leads out through a fourth metal layer wire, as shown in FIG. 7(c).

Here, the connection via 20 and the connection via 40 are connected through a connection conductor 36 formed using a second layer metal wire, and the connection via 40 and the connection via 60 are connected through a connection conductor 56 formed using a third layer metal wire.

According to the third embodiment of the present invention, a coil having the same area in a plane but an inductance of two times greater can be implemented.

Fourth Embodiment

Figure 8:
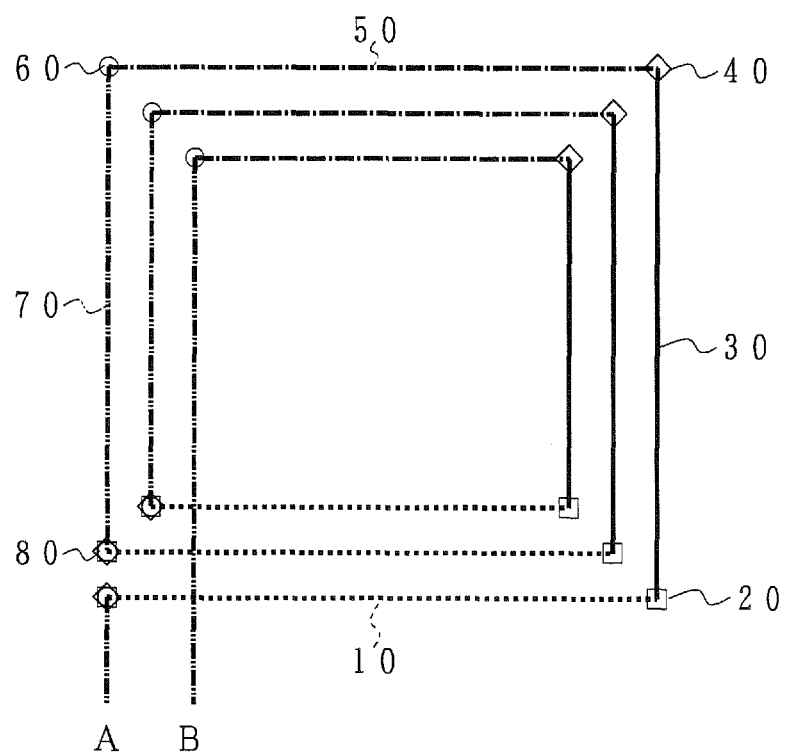
FIG. 8 is a conceptual projection plan diagram of the inductor element according to the fourth embodiment of the present invention.

Next, the inductor element according to the fourth embodiment of the present invention is described in reference to FIG. 8. The inductor element according to this embodiment has the same shape as that according to the first embodiment as seen from the top, and formed of coil elements provided in four layer levels, as in the third embodiment.

FIG. 8 is a conceptual projection plan diagram showing the inductor element according to the fourth embodiment of the present invention, and the coil elements 10, 30, 50 and 70 may be formed in a line and space pattern with a width of 1 μm, for example.

Here, in the figure, the first coil elements 10 are the dotted lines, the second coil elements 30 are the solid lines, the third coil elements 50 are the one-dot chain lines, and the fourth coil elements 70 are the two-dot chain lines.

As shown in the figure, straight first coil elements 10 are formed of first layer metal wires, second coil elements 30 which run in a direction perpendicular to the first coil elements 10 are formed of second layer metal wires, straight third coil elements 50 that face the first coil elements 10 with the opening of the coil in between are formed of third layer metal wires, and fourth coil elements 70 that face the second coil elements 30 with the opening of the coil in between are formed of fourth layer metal wires.

At this time, one end of one of the first coil elements 10 is connected to one end of one of the second coil elements 30 via a connection via 20, the other end of the second coil element 30 is connected to one end of one of the third coil elements 50 via a connection via 40, the other end of the third coil element 50 is connected to one end of one of the fourth coil elements 70 via a connection via 60, and the other end of the fourth coil element 70 is connected to one end of another first coil element 10 via a connection portion 80.

Connection repeated a necessary number of times to form the coil according to the fourth embodiment.

Here, the connection portion 80 has such a structure that the layers are in the order: connection via 20—connection conductor—connection via 40—connection conductor—connection via 60, as in FIG. 7(c).

In the case of the fourth embodiment of the present invention, the coil elements provided in one layer level are only on one side of the opening of the coil, and therefore the freedom in the arrangement of the peripheral wires in each layer level is high.

Fifth Embodiment

Next, the inductor element according to the fifth embodiment of the present invention is described in reference to FIG. 9. The inductor element according to the fifth embodiment is different from that according to the first embodiment only in its pattern as seen from the top, and the basic manufacturing process is exactly the same, and therefore only the conceptual projection plan diagram is described.

FIG. 9 is a conceptual projection plan diagram showing the inductor element according to the fifth embodiment of the present invention. The shape of the coil elements is modified so that the coil is octagonal as viewed from the top.

In this case the first coil elements $10_{11}$ to $10_{16}$ are formed of a straight portion that runs in the main direction of wires in the first metal wire layer, and diagonal portions that are provided at the two ends of the straight portion that bend 45° toward the center. In addition, the second coil elements $30_{11}$ to $30_{16}$ are formed of a straight portion that runs in the main direction of wires in the second metal wire layer, and diagonal portion that are provided at the two ends of the straight portion and bend 45° toward the center.

Thus, the first coil elements $10_{11}$ to $10_{16}$ and the second coil elements $30_{11}$ to $30_{16}$ are alternately connected through connection vias $20_{21}$ to $20_{32}$.

In this case also, peripheral wires can be provided so as to cross the opening at the center of the coil, as in the first embodiment.

In the fifth embodiment of the present invention, the coil pattern is octagonal as seen from the top, which is closer to circular shape, and therefore the performance of the coil is higher than that of the rectangular coil of the first embodiment.

Sixth Embodiment

Next, the inductor element according to the sixth embodiment of the present invention is described in reference to FIG. 10.

FIG. 10 is a conceptual projection plan diagram showing the inductor element according to the sixth embodiment of the present invention, where first coil elements $10_{31}$ to $10_{36}$ are formed of a straight portion that runs in the main direction of wires in the first metal wire layer, and second coil elements $30_{31}$ to $30_{36}$ are formed of a straight portion that runs in the main direction of wires in the second metal wire layer that bends 45° to the main direction of wires in the first metal layer.

In addition, third coil elements $50_{31}$ to $50_{36}$ are formed of a straight portion that runs in the main direction of wires in the third metal wire layer that bends 45° relative to the main direction of wires in the second metal layer, and fourth coil elements $70_{31}$ to $70_{36}$ are formed of a straight portion that runs in the main direction of wires in the fourth metal wire layer that bends 45° relative to the main direction of wires in the third metal layer.

The first coil elements $10_{31}$ to $10_{36}$, the second coil elements $30_{31}$ to $30_{36}$, the third coil elements $50_{31}$ to $50_{36}$ and the fourth coil elements $70_{31}$ to $70_{36}$ are connected in sequence through connection vias $20_{41}$ to $20_{46}$, $40_{31}$ to $40_{36}$ and $60_{31}$ to $60_{36}$ so as to form a coil.

Here, the connection portions $80_{31}$ to $80_{36}$ between the first coil elements $10_{31}$ to $10_{36}$ and the fourth coil elements $70_{31}$ to $70_{36}$ have such a structure that three vias are layered on top of each other with two connection conductors in between, as shown in FIG. 7(c).

In the sixth embodiment of the present invention also, the coil pattern is octagonal as seen from the top, which is closer to circular shape, and therefore the performance of the coil is higher than that of the rectangular coil of the first embodiment.

In addition, all coil elements are formed only of a straight element, and it is not necessary to for the element to bend 45° in the same layer level, unlike in the fourth embodiment, and therefore the design of the circuit pattern is simple.

Though the embodiments of the present invention are described above, the present invention is not limited to the structures and conditions for these embodiments, and various modifications are possible. For example a coil may be formed to have a six-layer structure or eight-layer structure.

In addition, though a coil is formed by connecting coil element provided in four layer levels in sequence in the fourth embodiment, the number of layer levels is not limited to four, and may be any number.

In the case where a coil is formed in three layer levels, for example, coil elements may be formed in the middle layer level so as to face each other with the opening of the coil in between, so that the connection is in the order such as: coil element 10—coil element 30—coil element 50—coil element 30—coil element 10—coil element 30 . . . .

In addition, though the coil elements and the connection vias are formed in different processes using a single damascene method according to the above described embodiments, the coil elements in the upper layer and connection vias may be formed at the same time using a dual damascene method.

In this case, the connection vias are also formed of Cu.

In addition, though a coil having bent sub-wires in two layer levels is formed in the second embodiment, sub-coils having bent sub-wires may be formed in two layer levels, and these two sub-coils connected so as to form a single coil in four layer levels, as in the third embodiment.

In addition, though an octagonal coil is formed in two layer levels according to the fifth embodiment, octagonal sub-coils may be formed in two layer levels, and these two sub coils connected so as to form a single coil in four layer levels, as in the third embodiment.

In addition, though coils are formed to have a buried wire structure using a damascene method according to the above embodiments, they may be formed to have a conventional wire structure using a metal, such as Al.

Industrial Applicability

A typical example of the present invention is inductor elements for communication between substrates in a three-dimensional semiconductor integrated circuit device where a number of semiconductors chips are stacked on top of each other, and the inductor element may be used as an L for a general circuit element, and the peripheral wire through the opening at the center of the coil is optional.

In addition, the present invention can also be applied to a three-dimensional circuit board device having three-dimensionally layered, printed circuit boards with discretely integrated semiconductor chips.

The invention claimed is:

1. An integrated circuit device comprising:
an inductor element comprising:
a plurality of first coil elements made of Al or Cu extending in a first main direction on a first layer level; and
a plurality of second coil elements made of Al or Cu extending in a second main direction on a second layer level;
wherein the first layer level and the second layer level are adjacent layer levels, said first main direction and said second main direction are different directions, said first coil elements are connected to said second coil elements so as to form a single coil having two or more turns, and
a wiring, running on the first layer level between the first coil elements, or running on the second layer level between the second coil elements.

2. The integrated circuit device according to claim 1, wherein the first and second coil elements have a straight, main portion on either side of the center portion of the inductor element, and an end portion of each of said first coil elements is connected to one of said second coil elements so as to form a single coil.

3. The integrated circuit device according to claim 1 or 2, wherein said coil consists of said first coil elements on a single layer level and said second coil elements on a single layer level and said first main direction and the second main direction are perpendicular.

4. The integrated circuit device according to claim 3, wherein each of said first and second coil elements are all formed of a straight wire part.

5. The integrated circuit device according to claim 3, wherein at least one element of said first and second coil elements are formed of a straight, main wire part and a bent, sub-wire part.

6. The integrated circuit device according to claim 3, wherein said first and second coil elements are formed of a straight, main wire part and a bent part connected to an end of said main wire part with an angle of 45° so that said coil forms an octagonal shape.

7. The integrated circuit device according to claim 1 or 2, wherein said coil is formed of two sub-coils formed of the first and second coil elements in two layer levels having said first main direction and the second main direction are perpendicular, and the first sub-coil winds inward and the second sub-coil winds outward.

8. The integrated circuit device according to claim 1 or 2, wherein said coil is formed of said first and second coil elements having a straight main portion provided in four layer levels with each consecutive main portion rotated 45° and connected between adjacent layer levels.

9. The integrated circuit device according to claim 1, wherein a the wire is provided in the main direction of wires on the first layer level and/or on the second layer level through the center portion of said coil.

10. The integrated circuit device according to claim 1, wherein the integrated circuit device is provided in a semiconductor chip.

11. The integrated circuit device according to claim 1, wherein the integrated circuit device is provided in a printed circuit board.

12. The integrated circuit devices according to claim 10 or 11, wherein the integrated circuit device is laminated with a second integrated circuit so as to magnetically communicate with said second integrated circuit using said inductor element.

* * * * *